United States Patent
Matsushima et al.

(10) Patent No.: US 6,856,442 B2
(45) Date of Patent: Feb. 15, 2005

(54) TRANSMISSION LINE, OPTICAL MODULE USING THE SAME AND MANUFACTURING METHOD OF OPTICAL MODULE

(75) Inventors: Naoki Matsushima, Yokohama (JP); Kazumi Kawamoto, Yokohama (JP); Hideyuki Kuwano, Yokohama (JP); Yoshiaki Niwa, Yokohama (JP)

(73) Assignee: OpNext Japan, Inc., Yokohama (JP)

( * ) Notice: Subject to any disclaimer, the term of this patent is extended or adjusted under 35 U.S.C. 154(b) by 0 days.

(21) Appl. No.: 10/383,912

(22) Filed: Mar. 7, 2003

(65) Prior Publication Data

US 2004/0070811 A1 Apr. 15, 2004

(30) Foreign Application Priority Data

Oct. 10, 2002 (JP) .......................................... 2002-297018

(51) Int. Cl.[7] .............................. G02F 1/03; G02F 1/07
(52) U.S. Cl. ........................ 359/254; 359/311; 359/291
(58) Field of Search ................................. 359/245–246, 359/248, 250, 252, 254, 290–292, 310–311; 345/84–85, 30, 108

(56) References Cited

U.S. PATENT DOCUMENTS

| 5,526,172 A | * | 6/1996 | Kanack ...................... 359/291 |
| 6,437,654 B2 | * | 8/2002 | Maruhashi et al. .......... 333/1.1 |
| 6,687,039 B2 | * | 2/2004 | Shirai .......................... 359/254 |

FOREIGN PATENT DOCUMENTS

JP    2001-257412    9/2001

* cited by examiner

Primary Examiner—Jordan M. Schwartz
Assistant Examiner—Jessica Stultz
(74) Attorney, Agent, or Firm—Townsend and Townsend and Crew LLP

(57) ABSTRACT

According to the present invention there are provided a transmission line and an optical module having the transmission line, the transmission line having on a dielectric substrate a first signal wiring conductor, a second signal wiring conductor insulated from the first signal wiring conductor, a first electrode disposed near the first and second signal wiring conductors, a second electrode disposed near the second signal wiring conductor, and a ground wiring conductor disposed in adjacency to the second electrode, wherein a passing frequency band can be changed by changing the connection of conductor wires.

10 Claims, 16 Drawing Sheets

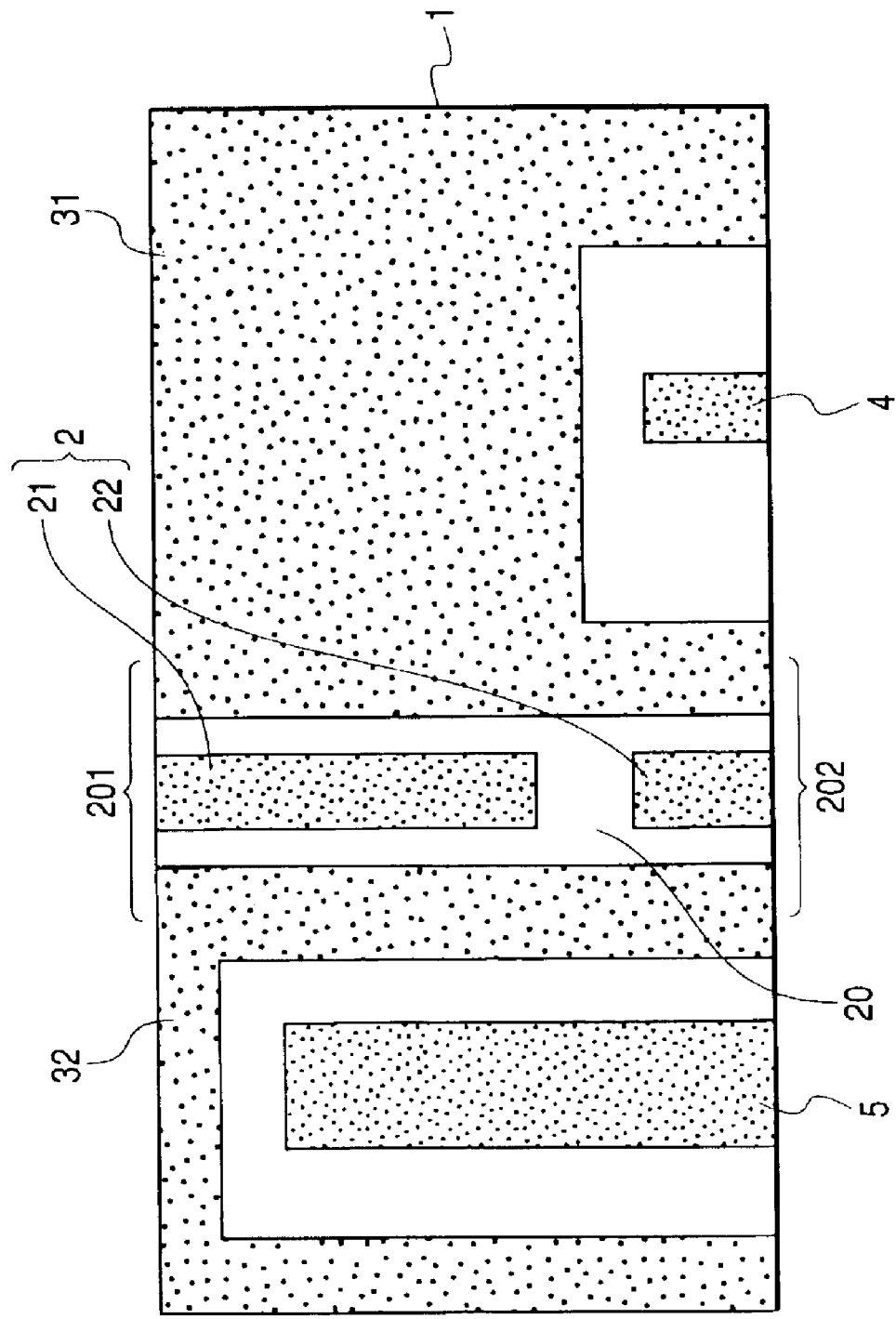

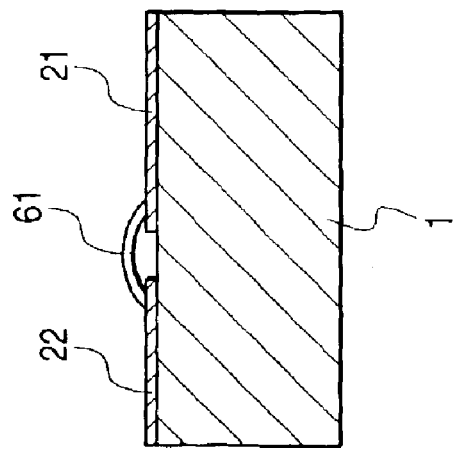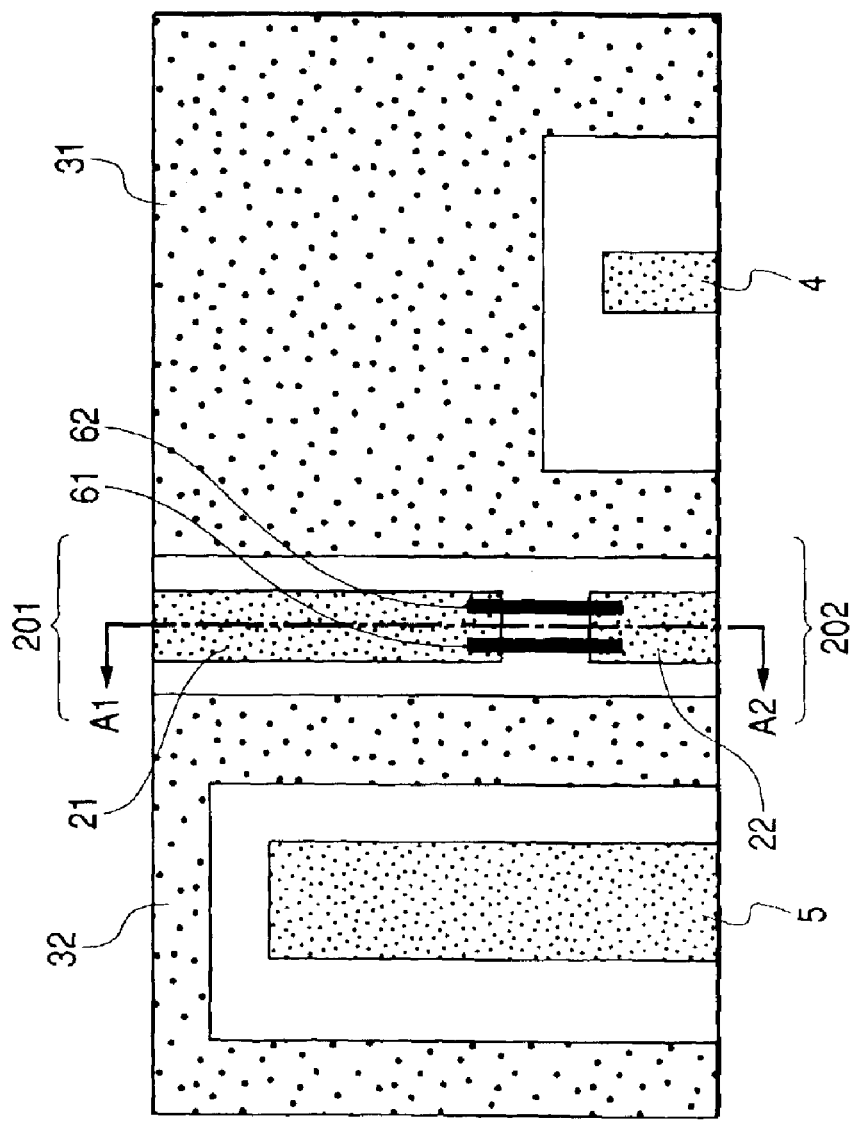

TRANSMISSION LINE, OPTICAL MODULE USING THE SAME AND MANUFACTURING METHOD OF OPTICAL MODULE

BACKGROUND OF THE INVENTION

The present invention relates to a transmission line technique and more particularly to a transmission line applicable for different frequency bands using the same wiring pattern, as well as an optical module using the transmission line as an electric signal feed line for feeding an electric signal to a laser diode or an optical modulator and a method of manufacturing the optical module.

In the optical communication field, transmission/reception data tend to become higher in bit rate every year with advanced computerization. Also as to the laser module for the transmission of an optical signal with use of an optical modulator, in order to transmit a high bit rate optical signal in the state where there is no error from a transmission side to a reception side, it is essentially necessary to improve high frequency characteristics of a high frequency transmission line which transmits an electric signal to the optical module. For example, in a package including a modulator integrated laser diode, a wide band is attained by connecting a terminal resistance and an optical modulator in parallel with each other, connecting a wire inductance and an impedance matching resistance with one grounded and the other in series with the said parallel connection, and connecting a high-frequency transmission line to an opposite end of the impedance matching resistance (see, for example, Japanese Patent Laid Open No. 257412/2001 (FIG. 1 and pages 4 to 5)).

SUMMARY OF THE INVENTION

As main products of optical transmission modules of a high bit rate there are mentioned 2.5 Gbit/s and 10 Gbit/s. Pass bands required for signal wirings used in these modules are shown in FIG. 18.

FIG. 18 is a characteristic diagram showing passing characteristics of the optical modules, in which frequency (GHz) and passing characteristic (S21) are plotted along the axis of abscissa and the axis of ordinate, respectively. In the same figure, a curved line 97 represents a passing characteristic (S21) required of the 10 Gbit/s optical module and its 3 dB cut-off frequency is required to be more than 10 GHz. On the other hand, a curved line 96 represents a passing characteristic required of the 2.5 Gbit/s optical module and it suffices for its 3 dB cut-off frequency to be in the range of 6 to 8 GHz. If a transmission line superior in passing characteristic in a high frequency region corresponding to the 10G optical module, even unnecessary high frequency component is passed; for example, in the event an input signal undergoes ringing in a driver IC, the ringing is transmitted to an output optical signal, with a consequent fear of deterioration of an output optical waveform and an increase of a bit error rate. Therefore, in the case of an optical module different in bit error rate, even if the other specifications than the bit error rate are the same, there sometimes occurs a case where a design specification of a transmission line cannot be satisfied unless it is made different.

For this reason it has heretofore been impossible to adopt means for making components of both 2.5 GHz and 10 GHz optical modules common to each other to attain the reduction of cost.

It is an object of the present invention to solve the above-mentioned problems and provide a transmission line technique capable of in any cases realizing good transmission characteristics in optical modules of different bit rates.

For achieving the above-mentioned object, in a high frequency transmission line having a signal wiring conductor and a ground wiring conductor on the surface or in the interior of a substrate, the present invention can adopt any of two transmission line structures, in one of which the signal wiring conductor is separated into first and second signal wiring conductors, and there are provided first and second electrodes separated from the signal wiring conductor and the ground wiring conductor, the first and second signal wiring conductors being electrically connected with each other, and in the other of which, in the above structure, the first signal wiring conductor and the first electrode are electrically connected with each other, the first electrode and the second signal wiring conductor are electrically connected with each other, and the second signal wiring conductor and the second electrode are electrically connected with each other.

For the above electrical connection there may be adopted a bonding method using a conductor wire such as Au wire. It is preferable that the area of the first electrode be smaller than that of the second electrode.

Moreover, in a structure wherein the above signal wiring conductor is separated into n number of conductors (n is an integer of 1 or more) and there are provided (n−1) number of the first electrodes and n number of the second electrodes, the present invention can adopt any of two transmission line structures, (1) in one of which the first and second signal wiring conductors are electrically connected with each other, the second and third signal wiring conductors are electrically connected with each other, . . . , and N−1$^{th}$ and N$^{th}$ signal wiring conductors are electrically connected with each other, and (2) in the other of which the first-signal wiring conductor and the first of the second electrodes are electrically connected with each other, the first signal wiring conductor and the first of the first electrodes are electrically connected with each other, the first of the first electrodes and the second signal wiring conductor are electrically connected with each other, the second signal wiring conductor and the second of the second electrodes are electrically connected with each other, the second signal wiring conductor and the second of the first electrodes are electrically connected with each other, the second of the first electrodes and the third signal wiring conductor are electrically connected with each other, . . . , the N−1$^{th}$ signal wiring conductor and the N−1$^{th}$ second electrode are electrically connected with each other, the N−1$^{th}$ signal wiring conductor and the N−1$^{th}$ first electrode are electrically conducted with each other, the N−1$^{th}$ first electrode and the N$^{th}$ signal wiring conductor are electrically connected with each other, and the N$^{th}$ signal wiring conductor and the N$^{th}$ second electrode are electrically connected with each other.

The present invention is further concerned with a method of manufacturing optical modules having different bit rates by changing the connection of conductor wires with use of transmission lines having the same wiring pattern shape to thereby change the passing characteristic of frequencies higher than 1 GHz.

BRIEF DESCRIPTION OF THE DRAWINGS

FIG. 1 is a top view showing a wiring pattern of a transmission line according to a first embodiment of the present invention;

FIG. 2(a) is a top view showing a construction diagram of the transmission line of the first embodiment with the wiring pattern of FIG. 1 being connected for an optical module of 10 Gbit/s;

FIG. 2(b) is a sectional view taken on line A1–A2 of FIG. 2(a);

DETAILED DESCRIPTION OF THE PREFERRED EMBODIMENTS

The present invention will be described in detail hereinunder by way of embodiments thereof illustrated in the accompanying drawings.

Figure 3A:
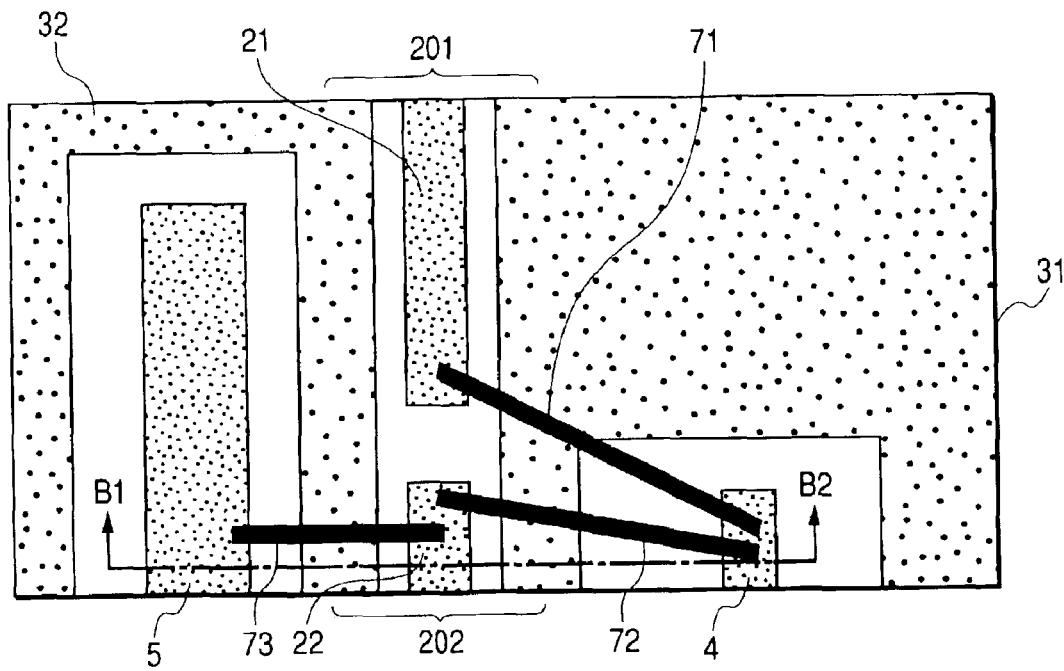
FIG. 3(a) is a top view showing a construction diagram of the transmission line of the first embodiment with the wiring pattern of FIG. 1 being connected for an optical module of 2.5 Gbit/s.
Figure 3B:
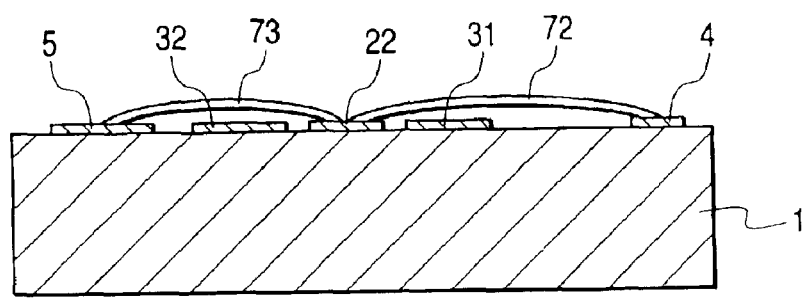
FIG. 3(b) is a sectional view taken on line B1–B2 of FIG. 3(a)

FIG. 1 is a top view showing a first example of a wiring pattern of a transmission line according to the present invention. FIG. 2 is a construction diagram of a transmission line according to a first embodiment of the present invention, with the wiring pattern of FIG. 1 being connected for an optical module of 10 Gbit/s, in which FIG. 2(a) is a top view and FIG. 2(b) is a sectional view taken on line A1–A2 of FIG. 2(a). FIG. 3 is a construction diagram with the wiring pattern of FIG. 1 connected for an optical module of 2.5 Gbit/s, in which FIG. 3(a) is a top view and FIG. 3(b) is a sectional view taken on line B1–B2 of FIG. 3(a).

As shown in FIG. 1, a wiring conductor of the illustrated transmission line is formed on a surface of a substrate 1 which is formed by a dielectric. The transmission line is in the form of a coplanar line in which first and second ground wiring conductors 31, 32 are formed on both sides of a signal wiring conductor 2. The signal wiring conductor 2 is electrically insulated in a disconnected portion 20 located at an intermediate position thereof and is divided into a signal wiring conductor 21 and a second signal wiring conductor 22. The first and second ground wiring conductors 31, 32 are formed on both sides of the first and second signal wiring conductors 21, 22. Near this transmission line is disposed a first electrode 4 which is electrically insulated from the first and second signal wiring conductors 21, 22 and from the first and second ground wiring conductors 31, 32. Further, on the side opposite to the first electrode 4 with respect to the first and second signal wiring conductors 21, 22 is formed a second electrode 5 which is electrically insulated from the first and second wiring conductors 21, 22 and the first and second ground wiring conductors 31, 32. In this embodiment, the area of the first electrode 4 is smaller than that of the second electrode 5.

An electric signal is inputted from a signal input terminal 201, then is propagated through the transmission line and is outputted from a signal output terminal 202. In the state of FIG. 1, however, the electric signal is not propagated because the signal wiring conductor 2 is disconnected. Therefore, it is necessary to make an electrical connection using a conductor wire. In this embodiment, Au wire having a diameter of 25 $\mu$m is used as the conductor wire.

A first connecting method using conductor wires is shown in FIG. 2. According to this method, the first and second signal wiring conductors 21 and 22 are connected with each other using conductor wires. Two conductor wires 61 and 62 are used in this embodiment. If the signal wiring conductors 21 and 22 are connected together using a single conductor wire of 25 $\mu$m in diameter, an electric field vector between the first, second signal wiring conductors 21, 22 and the first, second ground wiring conductors 31, 32 and that between the conductor wire and the first, second ground wiring conductors 31, 32 vary greatly, so it is desirable to use two or more conductor wires. A larger number than two may be adopted, but when transmission characteristics and the time required for the manufacture are taken into account, two is most appropriate. However, in the case of a ribbon type (flat type) conductor wire having a width of 75 $\mu$m and a thickness of 20 $\mu$m, the use of only one such ribbon type conductor wire is acceptable because an electric field vector between the first, second signal wiring conductors and the first, second ground wiring conductors 31, 32 and that between the said conductor wire and the first, second ground wiring conductors 31, 32 do not vary so greatly.

As is seen from the sectional view of FIG. 2(b), only both end portions of the conductor wire 61 are bonded to the first and second signal wiring conductors 21, 22 and the other portion thereof is not in contact with any portion. This is also the case with the conductor wire 62. Such a form of the transmission line corresponds to a general coplanar transmission line form in which a signal is propagated while forming an electric field between the first, second signal wiring conductors 21, 22 and the first, second ground wiring conductors 31, 32 located on both sides of the signal wiring conductors. This transmission line is superior in high frequency transmission characteristic, that is, possesses a wide band characteristic, exhibiting a good passing characteristic (S21) even in a high frequency region of more than 10 GHZ, and is therefore suitable for use in an optical module of 10 Gbit/s.

Next, with reference to FIG. 3, a description will be given below about a second connecting method using conductor wires. First, as shown in FIG. 3(a), a portion near the tip of the first signal wiring conductor 21 and the first electrode 4 are electrically connected with each other, for example, by bonding with use of a conductor wire 71. Next, the first electrode 4 and a portion near the tip of the second signal wiring conductor 22 are electrically connected with each other, for example, by bonding with use of a conductor wire 72. Lastly, the second electrode 5 and the second signal wiring conductor 22 are electrically connected with each other, for example, by bonding with use of a conductor wire 73. As shown in FIG. 3(b), only both end portions of the conductor wire 72 are connected to the signal wiring conductor 22 and the first electrode 4 and the other portion thereof is not in contact with any portion. Also as to the conductor wire 73, only its both end portions are connected to the signal wiring conductor 22 and the second electrode 5 and the other portion thereof is not in contact with any portion. This is also the case with the conductor wire 71 though not shown.

Reference will be made below to an equivalent circuit of the transmission line shown in FIG. 3.

Figure 4:
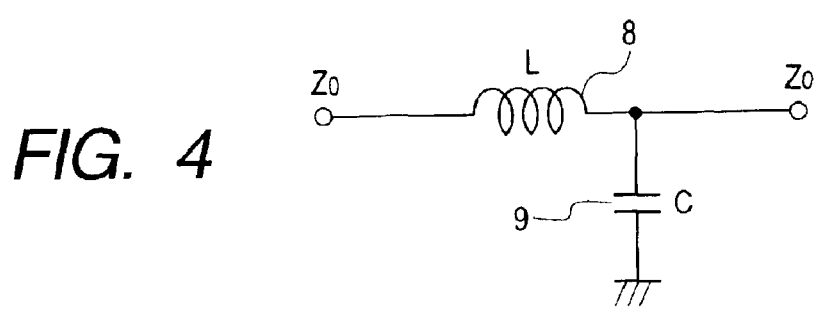
FIG. 4 is a circuit diagram showing an example of an equivalent circuit of the transmission line illustrated in FIG. 3.

FIG. 4 is a circuit diagram showing an example of an equivalent circuit of the transmission line illustrated in FIG. 3. The transmission line shown in FIG. 3(a) constitutes a low-pass filter in which an inductor 8 is inserted in series with a signal line and a capacitor 9 is inserted between the signal line and the ground. The inductor 8 is mainly constituted by the conductor wires 71 and 72, and the capacitor 9 functions mainly between the second electrode 5 and the second ground wiring conductor 32. In the transmission line shown in FIG. 3, by setting the values of the inductor 8 and the capacitor 9 in such a manner that the transmission line exhibits a desired cut-off frequency, it is possible to form a low-pass filter which can deteriorate the passing characteristic of a high frequency region.

More particularly, an inductance L and a capacitance C which afford such 3 dB cut-off frequency $f_c$ as the passing characteristic goes down by −3 dB can be obtained in accordance with the following equations (1) and (2), assuming that a characteristic impedance of the transmission line is $Z_0$:

$$C=1/(2\pi f_c Z_0) \quad (1)$$

$$L=Z_0/(\pi f_c) \quad (2)$$

In an actual transmission line, the inductance 8 is determined mainly by the lengths of the conductor wires 71 and 72, so there is determined an inductance per unit length and the position of the first electrode 4 is adjusted so as to give an appropriate length of each wire. As to the capacitance, it depends on the size of the second electrode 5, a gap spacing between the second electrode 5 and the second ground wiring conductor, dielectric constant of the dielectric, and the thickness of the second ground wiring conductor. It is difficult of estimate exact values by simple calculations, so for determining dimensions, it is necessary to perform electromagnetic field analysis simulation and make sure that a desired cut-off frequency is exhibited.

FIG. 5 shows calculation results of transmission characteristics obtained by electromagnetic field analysis of the transmission lines according to the present invention which are illustrated in FIGS. 2 and 3.

Figure 5A:
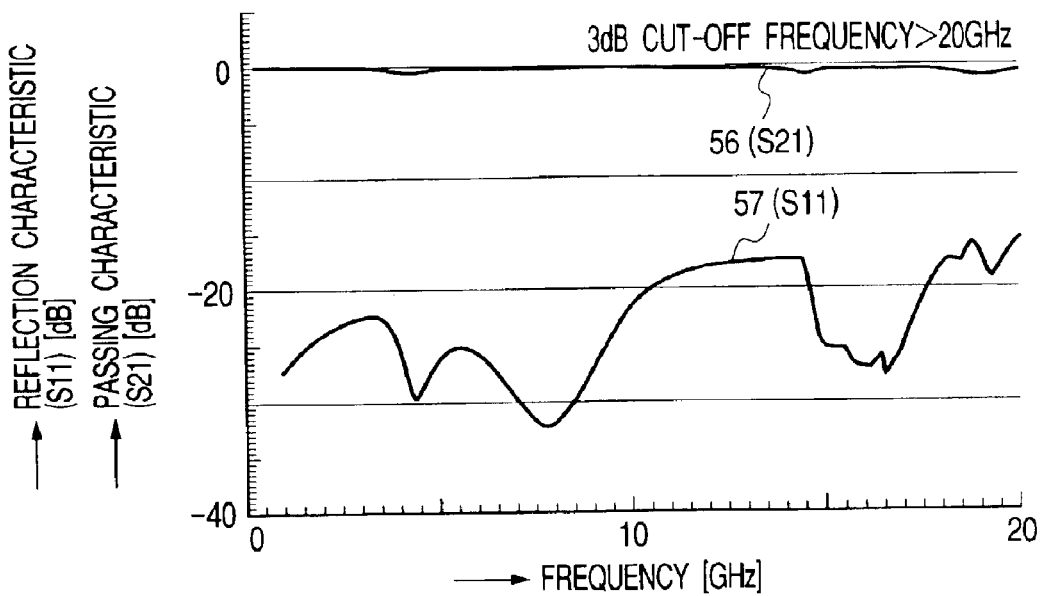
FIGS. 5(a) and 5(b) are a characteristic diagram showing an example of transmission characteristics obtained by electromagnetic field analysis with respect to the transmission lines illustrated in FIGS. 2 and 3.
Figure 5B:
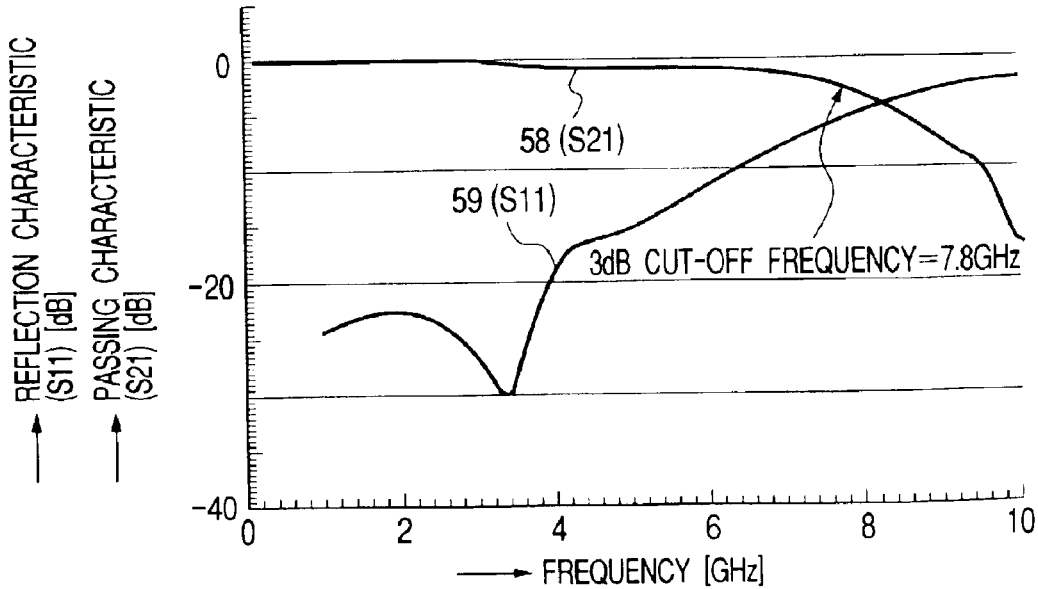

FIG. 5 is a characteristic diagram showing an example of transmission characteristics obtained by electromagnetic field analysis of the transmission lines shown in FIGS. 2 and 3, in which FIG. 5(a) shows transmission characteristics of the transmission line illustrated in FIG. 2 and FIG. 5(b) shows transmission characteristics of the transmission line illustrated in FIG. 3. In FIGS. 5(a) and 5(b), frequency (GHz) is plotted along the axis of abscissa, while reflection characteristic (S11) and passing characteristic (S21) are plotted along the axis of ordinate. In FIG. 5(a), curved lines 56 and 57 represent a passing characteristic (S21) and a reflection characteristic (S11), respectively, of the transmission line shown in FIG. 2. In FIG. 5(b), curved lines 58 and 59 represent a passing characteristic (S21) and a reflection characteristic (S1), respectively, of the transmission line shown in FIG. 3.

Figure 6:
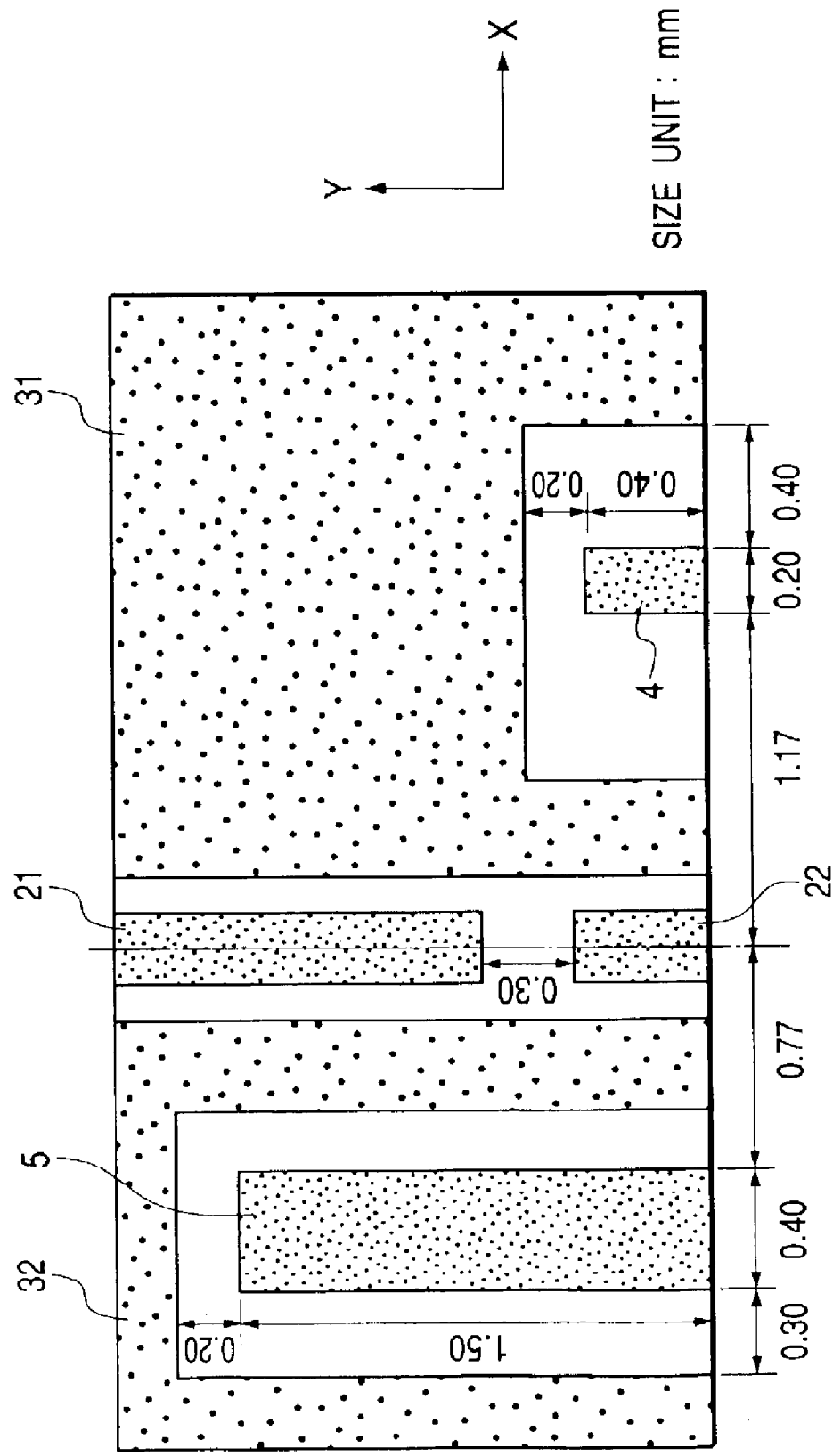
FIG. 6 is a plan view showing dimensions of various portions of a transmission line in simulation of FIG. 5.

FIG. 6 is a plan view showing dimensions of various portions of a transmission line in simulation of FIG. 5. Using a basic transmission line having those dimensions, the transmission lines shown in FIGS. 2 and 3 were constituted and there were calculated transmission characteristics by electromagnetic field analysis shown in FIG. 5. FIG. 6 has been designed so that 3 dB cut-off frequency $f_c$ becomes 8 GHz when adopting the conductor wire connecting method shown in FIG. 3. In FIG. 6, the spacing between the first and second signal wiring conductors 21, 22 is set at 0.30 mm. Further, the design was made so as to give the following values. The distance from a central line passing through the axes of the first and second signal wiring conductors 21, 22 up to one end portion of the first electrode 4 is 1.17 mm, the width of the first electrode 4 is, 0.20 mm, the spacing between an opposite end portion of the first electrode 4 in x direction and the first ground wiring conductor 31 is 0.40 mm, the length of the first electrode 4 in y direction is 0.40 mm, the spacing between the first electrode 4 and the first ground wiring conductor 31 in y direction is 0.20 mm, the distance in x direction from the aforesaid central line and one end portion of the second electrode 5 is 0.77 mm, the width of the second electrode 5 in x direction is 0.40 mm, the spacing between an opposite end portion of the second electrode 5 in x direction and the second electrode 5 is 0.30 mm, the length of the second electrode in y direction is 1.50 mm, and the spacing between the second electrode 5 and the second ground wiring conductor 32 in y direction is 0.20 mm.

In FIG. 5, the passing characteristic (S21) corresponds to a ratio between the magnitude of a signal inputted from the terminal 201 and that of a signal appearing at the terminal 202 in FIG. 1, and the reflection characteristic (S11) corresponds to a ratio between the magnitude of a signal fed from the input terminal and that of a signal reflected and returned through the transmission line.

A look at the characteristics of FIG. 5(a) shows that, as is apparent from the curved line 56, the passing characteristic (S21) is good also in the region of above 10 GHz, and that the 3 dB cut-off frequency is above 20 GHz. At a frequency of below 10 GHz, it suffices for the reflection characteristic (S11) to be below −10 dB, but the curved line 57 indicates below −20 dB. Thus, the FIG. 2 transmission line having such characteristics is fully applicable to an optical module of 10 Gbit/s.

On the other hand, FIG. 5(b) shows characteristics of the transmission line illustrated in FIG. 3, in which, as indicated with the curved line 58, the passing characteristic (S21) attenuates gradually to −3 dB at a frequency of 7.8 GHz. Thus, a satisfactory passing characteristic is ensured in an actual working band of 2.5 GHz. Also as to the reflection characteristic (S11), as indicated with the curved line 59, it is below −10 dB in a passing band of 2.5 GHz. Thus, the FIG. 3 transmission line having such characteristics is fully applicable to an optical module of 2.5 Gbit/s.

As described above, the use of the transmission line structure of this embodiment permits changing the passing band by only changing the conductor wire connecting method even with use of the same wiring pattern.

Next, with reference to FIGS. 7 to 9, a description will be given below about an example in which the transmission lines shown in FIGS. 2 and 3 are applied to an optical module.

Figure 7:
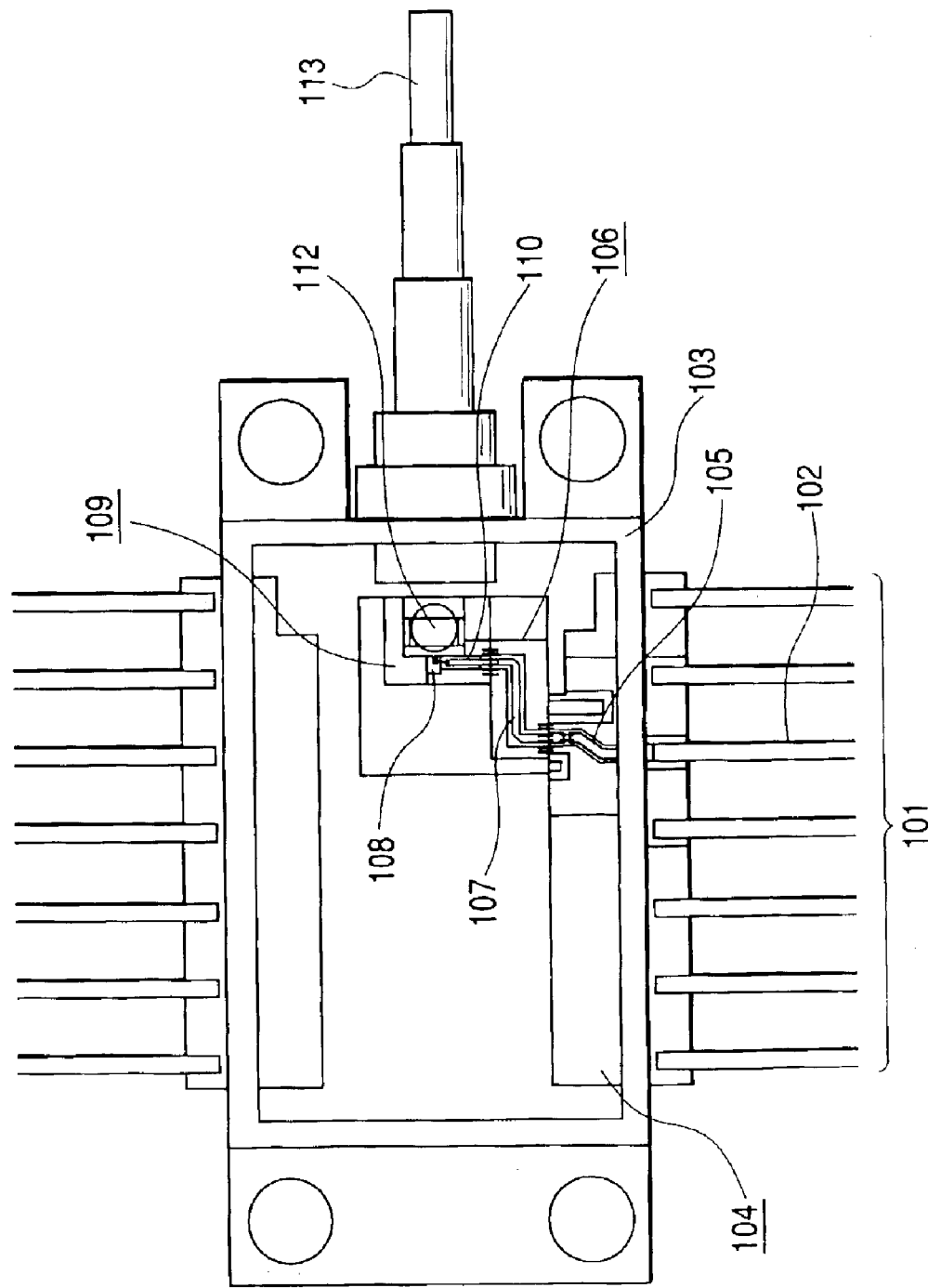
FIG. 7 is a top view showing an example of an entire optical module according to the present invention.
Figure 8:
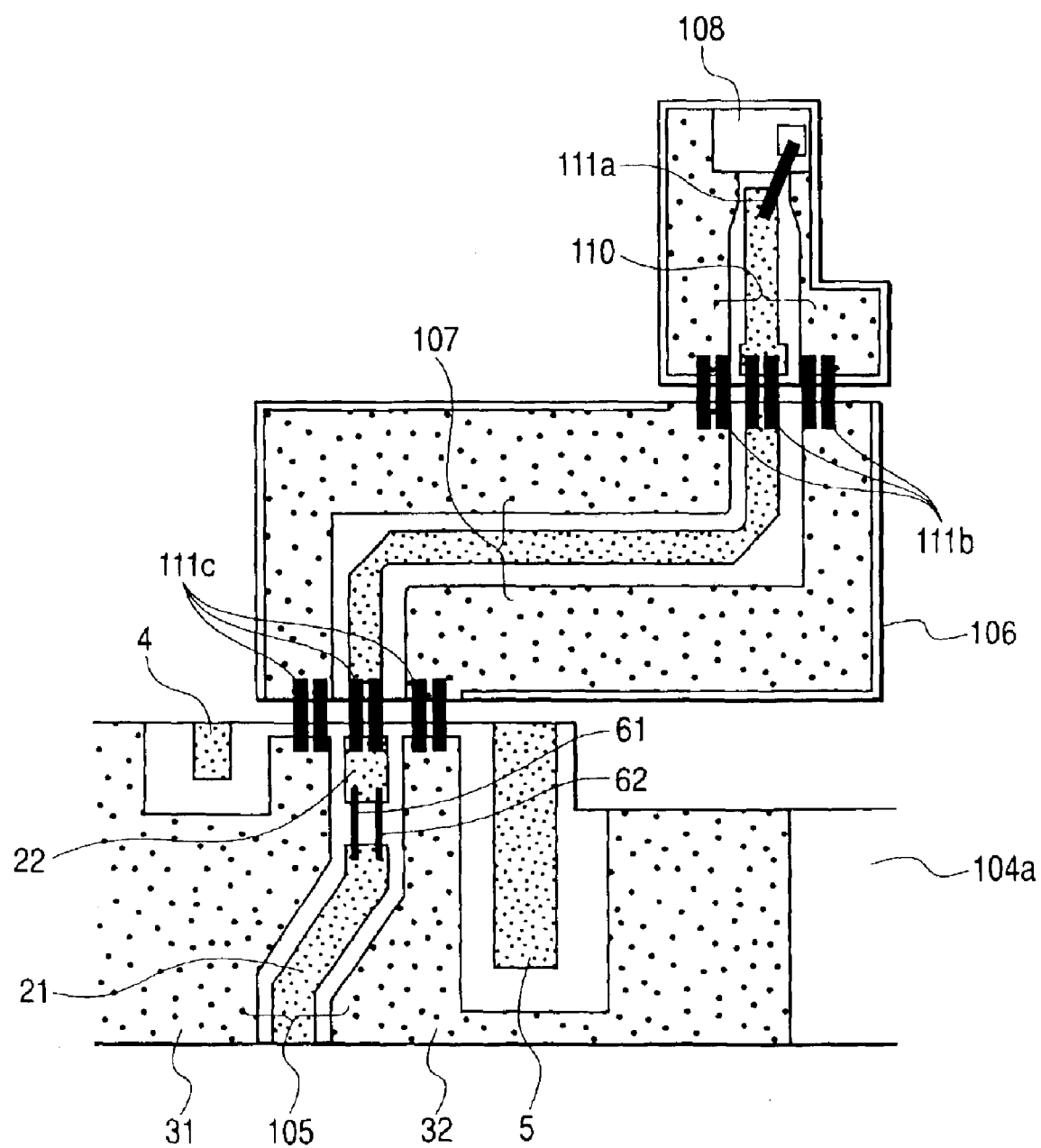
FIG. 8 is an enlarged top view showing a transmission line portion of the optical module using the transmission line of FIG. 2.
Figure 9:
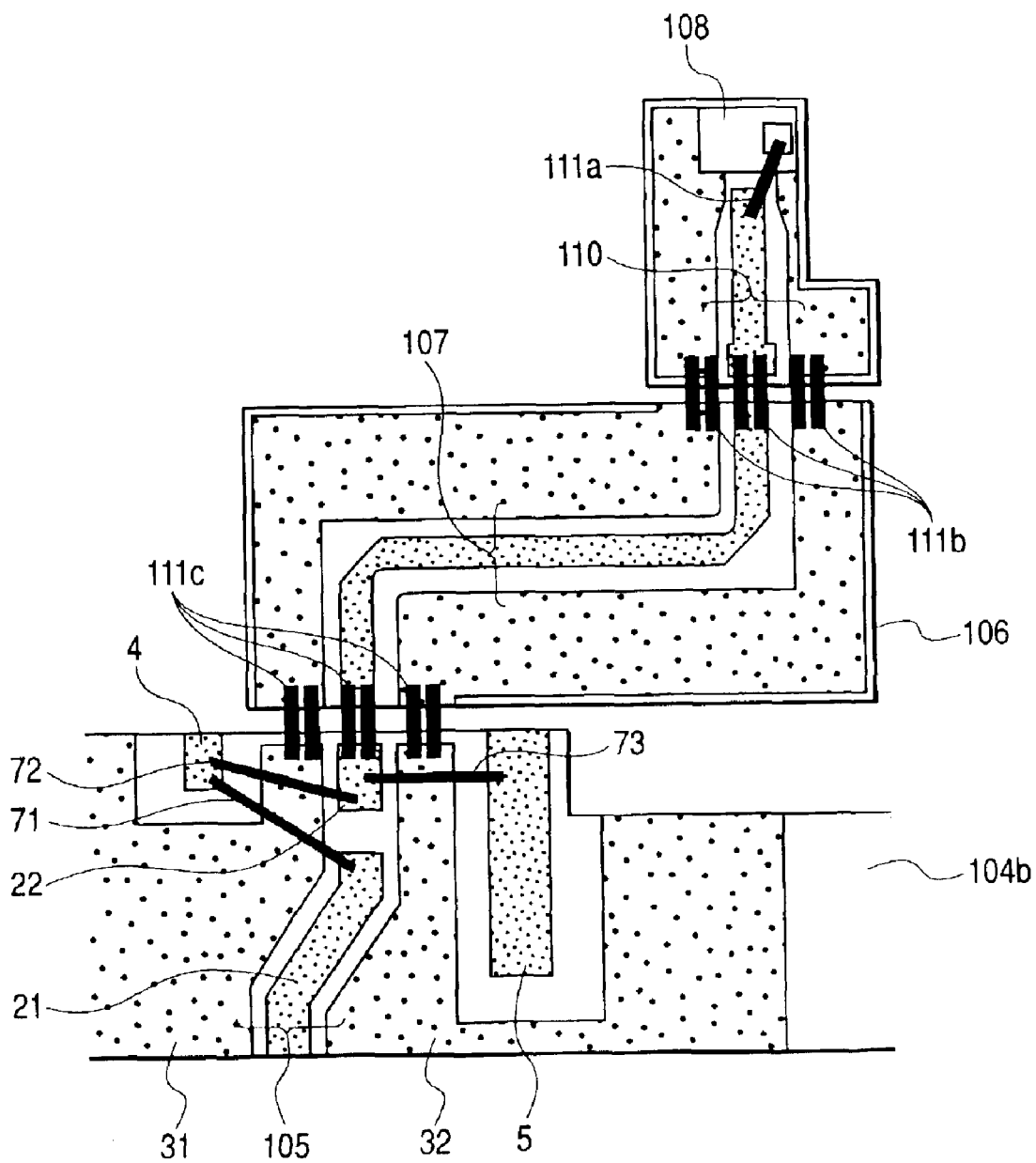
FIG. 9 is an enlarged top view showing a transmission line portion of the optical module using the transmission line of FIG. 3.

FIG. 7 is a top view showing an example of an entire optical module according to the present invention, FIG. 8 is an enlarged top view showing a transmission line portion of the optical module using the FIG. 2 transmission line, and FIG. 9 is an enlarged top view showing a transmission line portion of the optical module using the FIG. 3 transmission line.

As shown in FIG. 7, the optical module inputs an electric signal from a signal input terminal 102 of lead wire 101. A transmission substrate used in this optical module is composed of a dielectric substrate (hereinafter referred to as "package substrate") 104 on which is formed a transmission line for conducting an electric signal inputted from the exterior by the signal input terminal to the interior of a module package 103, a chip carrier substrate 109 with an optical element (an optical modulator, a laser diode) 108 mounted thereon and having a transmission line 110, and a dielectric substrate ("relay substrate") 106 having a relay transmission line 107 for conducting an electric signal from the dielectric substrate 104 to the transmission line 110 on the chip carrier substrate 109. The module package 103 houses therein at least a portion of the transmission substrate and the optical modulator 108. As a result, the input signal is propagated through a transmission line 105 formed on the package substrate 104 which is incorporated in the module package 103, then passes through the relay transmission line 107 formed on the relay substrate 106, further passes through the transmission line 110 formed on the chip carrier substrate 109 with the optical element 108 mounted thereon, and is transmitted to the optical element 108. The lines are electrically connected together by conductor wires 111a to 111c (see FIGS. 8 and 9). In this embodiment, an optical modulator integrated laser diode is used as the optical element 108. The transmission line according to the present invention is provided in the transmission line 105 formed on the module package 103. Its structure is basically the same as the structures of FIGS. 2 and 3. In the optical modulator of the semiconductor laser 108, an input electric signal is converted to an optical signal, which is outputted from the laser diode 108. This light beam is condensed by a lens 112 located in front of the laser diode 108 and is emitted to an optical fiber 113 located in front of the lens 112, thus is outputted as an optical signal.

Next, with reference to FIGS. 8 and 9, a description will be given below about the transmission line portion of this optical module. In these figure, the same components as in FIGS. 1 to 3 and 7 are identified by like reference numerals, and explanations thereof will be omitted.

FIGS. 8 and 9 are different in the conductor wire connecting method in the transmission line portion of the package substrate according to the present invention.

A package substrate 104a shown in FIG. 8 uses the same transmission line as in FIG. 2. A package substrate 104b shown in FIG. 9 is constructed so as to provide a narrow band using the same transmission line as in FIG. 3 and is designed so that the 3 dB cut-off frequency of the transmission line becomes 7 GHz.

Calculation results obtained by electromagnetic field analysis and circuit simulation with respect to transmission characteristics of the optical modules shown in FIGS. 8 and 9 will be described below with reference to FIG. 10.

Figure 10A:
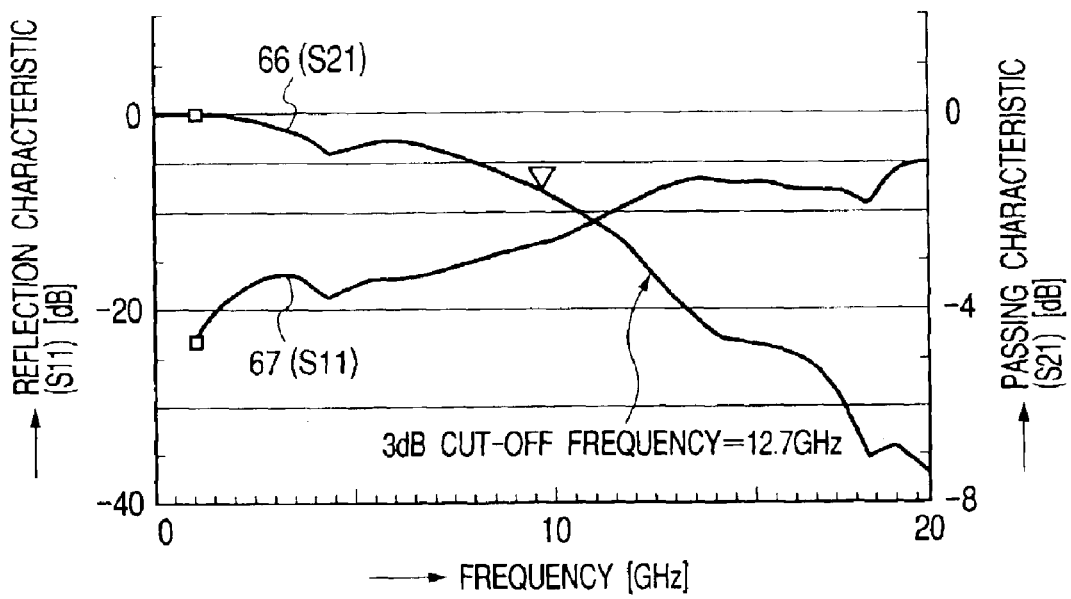
FIGS. 10(a) and 10(b) are a characteristic diagram showing an example of transmission characteristics obtained by electromagnetic field analysis and circuit simulation of the optical modules illustrated in FIGS. 8 and 9.
Figure 10B:
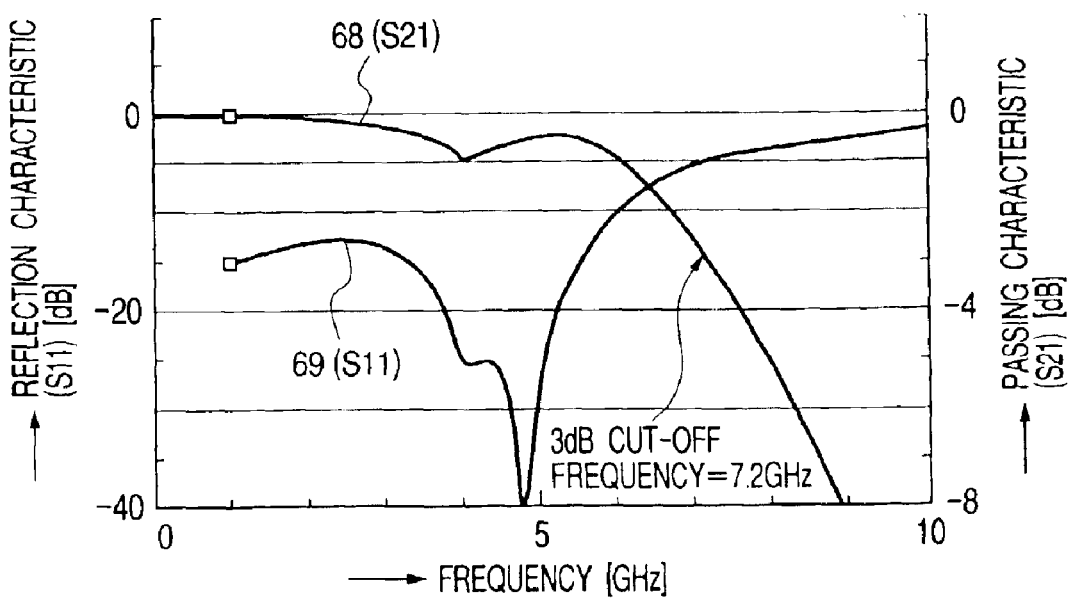

FIG. 10 is a characteristic diagram showing an example of transmission characteristics obtained by electromagnetic field analysis and circuit simulation of the optical modules shown in FIGS. 8 and 9, in which FIG. 10(a) shows transmission characteristics of the transmission line illustrated in FIG. 8 and FIG. 10(b) shows transmission characteristics of the transmission line illustrated in FIG. 9. In both FIGS. 10(a) and 10(b), frequency (GHz) is plotted along the axis of abscissa, while reflection characteristic (S11) (dB) and passing characteristic (S21) (dB) are plotted along the axis of ordinate. In FIG. 10(a), curved lines 66 and 67 represent passing characteristic (S21) and reflection characteristic (S11), respectively. In FIG. 10(b), curved lines 68 and 69 represent passing characteristic (S21) and reflection characteristic (S11), respectively.

As shown in FIG. 10(a), the 3 dB cut-off frequency is about 12.7 GHz, thus proving that satisfactory transmission characteristics are obtained as an optical module of 10 Gbit/s. More particularly, the actual pass band is approximately 8 GHz, but a decrease of the pass band characteristic at 8 GHz is below −1 dB and the reflection characteristic is below −10 dB at 10 GHz. Thus, the optical module of FIG. 8 having such characteristics is applicable to an optical module of 10 Gbit/s.

As shown in FIG. 10(b), the attenuation in the high frequency region is marked, with the 3 dB cut-off frequency being approximately 7 GHz. The reason why this is different from the cut-off frequency of transmission line alone is that the attenuation of the optical element itself is also included. With such transmission characteristics, there is no passage through an unnecessary high frequency region and so there is no fear that a waveform defect such as ringing of an input signal may be transmitted to an output optical waveform. Moreover, the actual pass band is approximately 2.5 GHz, but at this frequency the passing characteristic attenuates little. As to the reflection characteristic, a satisfactory characteristic can be ensured because it is less than −10 dB at a frequency of 2.5 GHz. Therefore, the optical module of FIG. 9 having such transmission characteristics can be applied to an optical module of 2.5 Gbit/s.

A second embodiment of the present invention will be described below with reference to FIGS. 11 to 13.

Figure 11:
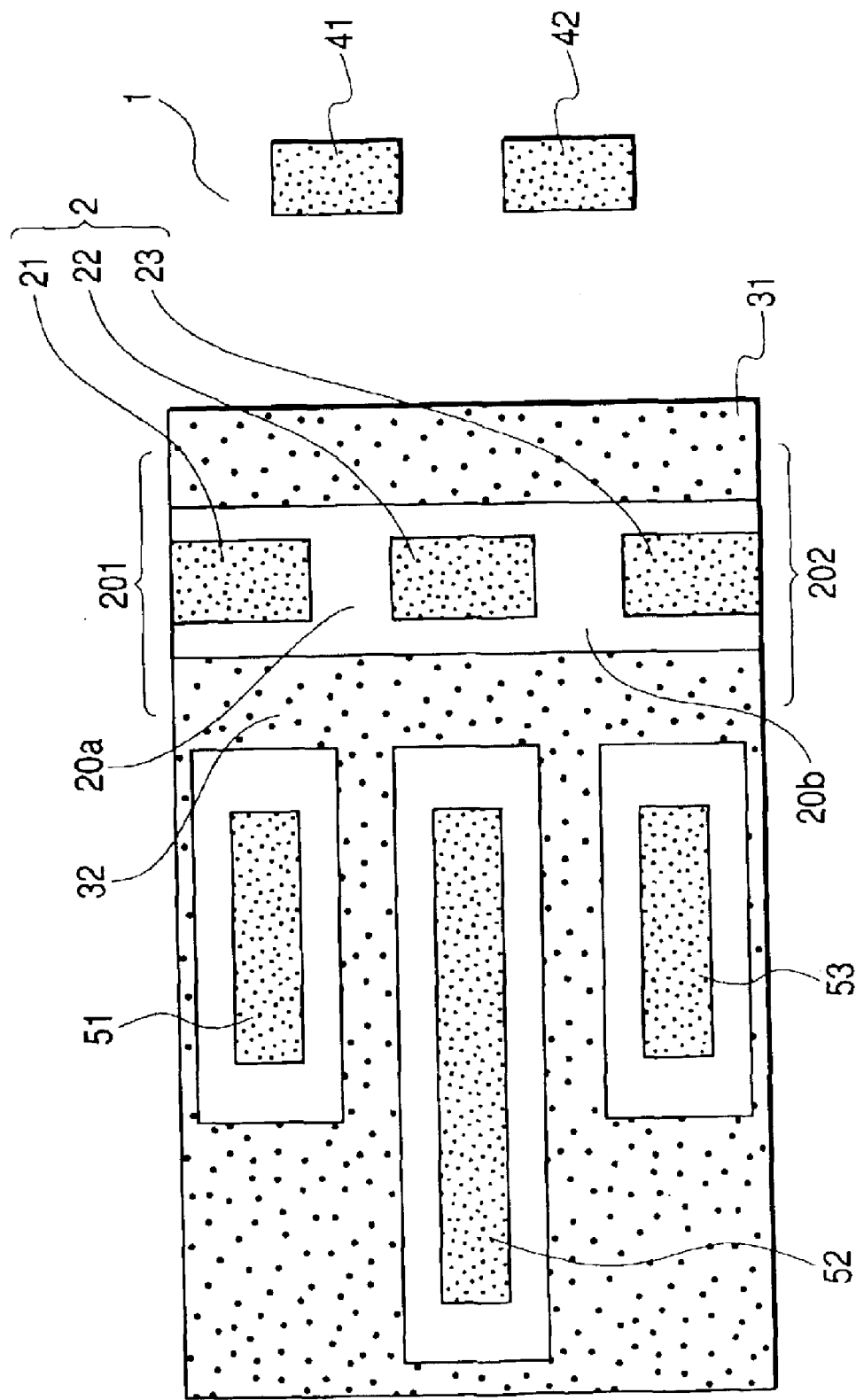
FIG. 11 is a top view showing a wiring pattern of a transmission line according to a second embodiment of the present invention.

FIG. 11 is a top view showing a wiring pattern of a transmission line according to a second embodiment of the present invention. FIG. 12 is a construction diagram showing the transmission line of the second embodiment with the wiring pattern of FIG. 11 being connected for an optical module of 10 Gbit/s. FIG. 13 is a construction diagram of the transmission line of the second embodiment with the wiring pattern of FIG. 11 being connected for an optical module of 2.5 Gbit/s.

Although in the embodiment of FIG. 3 there are used one first electrode serving as an inductor and one second electrode as a capacitor, plural such inductors and capacitors may be present. In the embodiment illustrated in FIG. 13 there are used two inductors and three capacitors.

In FIG. 11, which illustrates a wiring pattern according to a second embodiment of the present invention, a signal wiring conductor is composed of a first signal wiring conductor 21, a second signal wiring conductor 22, and a third signal wiring conductor 23. Disconnected portions 20a and 20b are provided respectively between the first and second signal wiring conductors 21, 22 and between the second and third signal wiring conductors 22, 23. As a first electrode group there are formed two electrodes which are an A1 electrode 41 as a first electrode and a B1 electrode 42 as a second electrode. Further, as a second electrode group there are formed three electrodes which are an A2 electrode 51 as a first electrode, a B2 electrode 52 as a second electrode, and a C2 electrode 53 as a third electrode.

Figure 12:
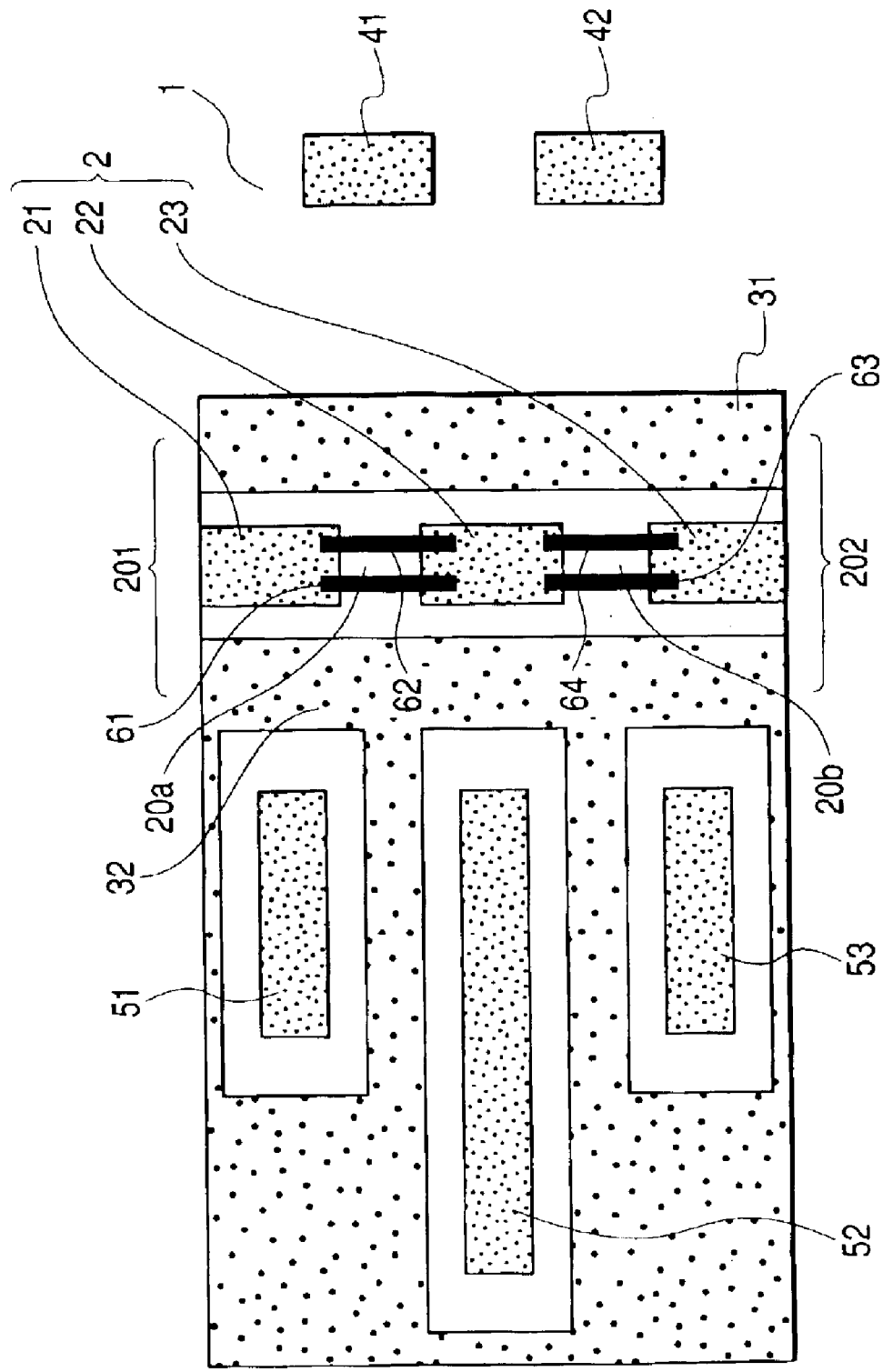
FIG. 12 is a construction diagram of the transmission line of the second embodiment with the wiring pattern of FIG. 11 being connected for an optical module of 10 Gbit/s.

FIG. 12 shows a first connecting method for conductor wires, in which a portion near one end of the first signal wiring conductor 21 and a portion near one end of the second signal wiring conductor 22 adjacent thereto are electrically connected with each other, for example, by bonding using two conductor wires 61 and 62. The conductor wires used are Au wires having a diameter of 25 μm like that illustrated in FIG. 1. Next, a portion near an opposite end of the second signal wiring conductor 22 and a portion near one end of the third signal wiring conductor 23 adjacent thereto are electrically connected with each other also using two conductor wires 63 and 64 for example. As in the embodiment illustrated in FIG. 1, the conductor wires 61 to 64 are not in contact with any portion except their both end portions. The transmission line thus connected becomes a general coplanar type transmission line as in FIG. 2 and thus its high frequency characteristics are satisfactory. The transmission line of this embodiment is suitable for application to an optical module of 10 Gbit/s.

Figure 13:
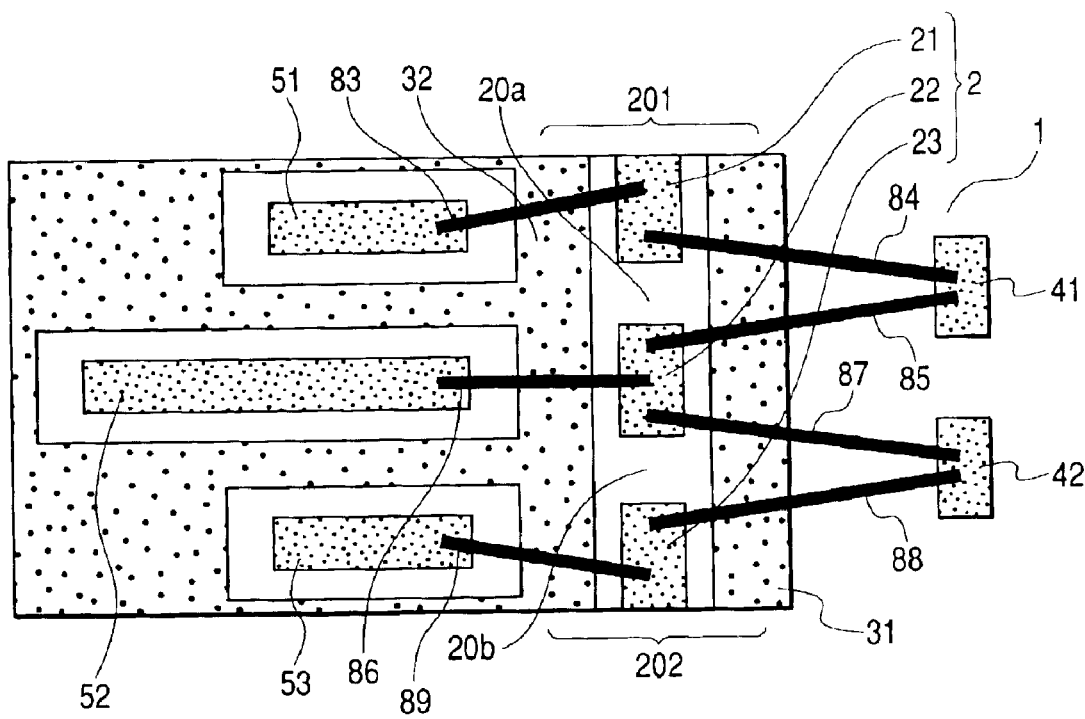
FIG. 13 is a construction diagram of the transmission line of the second embodiment with the wiring pattern of FIG. 11 being connected for an optical module of 2.5 Gbit/s.

Next, a second connecting method for conductor wires is shown in FIG. 13. First, the first signal wiring conductor 21 and the A2 electrode 51 included in the second electrode group are electrically connected with each other, for example, by bonding using a conductor wire 83. Next, a portion near one end of the first signal wiring conductor 21 and the A1 electrode 41 included in the first electrode group are electrically connected with each other using a conductor wire 84. Then, the A1 electrode 41 included in the first electrode group and a portion near one end of the second signal wiring conductor 22 on the side adjacent to the first signal wiring conductor 21 are electrically connected with each other using a conductor wire 85. Thereafter, the second signal wiring conductor 22 and the A2 electrode 52 included in the second electrode group are electrically connected with each other using a conductor wire 86. Next, a portion near an opposite end of the second signal wiring conductor 22 which end is adjacent to the third signal wiring conductor 23 and the B1 electrode 42 included in the first electrode group B1 are electrically connected with each other using a conductor wire 87. Next, the B1 electrode 42 included in the first electrode group and a portion near one end of the third signal wiring conductor 23 which end is adjacent to the second signal wiring conductor 22 are electrically connected with each other using a conductor wire 88. Lastly, the third signal wiring conductor 23 and the C2 electrode 53 included in the second electrode group are electrically connected with each other using a conductor wire 89. As in the embodiment illustrated in FIG. 1, the conductor wires 83 to 89 are not in contact with any portion except their both end portions. The transmission line in question can be endowed with the characteristics shown in FIG. 5(b) and is therefore applicable to an optical module of 2.5 Gbit/s.

Figure 14:
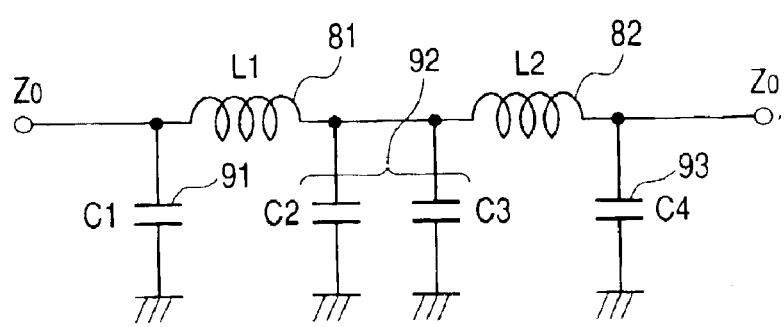
FIG. 14 is a circuit diagram showing an example of an equivalent circuit of the transmission line illustrated in FIG. 13.

FIG. 14 is a circuit diagram showing an example of an equivalent circuit of the transmission line illustrated in FIG. 13. The same equations as those referred to above in connection with FIG. 4 are also applicable here, but as is seen from FIG. 14, a capacitor 92 located at an intermediate position is required to have a capacitance twice that of capacitors 91 and 93 located on both sides. For this reason, the size of the B2 electrode 52 in the second electrode group shown in FIG. 13 is twice that of the other electrodes included in the second electrode group, i.e., A2 electrode 51 and C2 electrode 53.

In the equivalent circuit diagram of FIG. 14, the capacitor 91 mainly serves as a capacitor between the A2 electrode 51 and a second ground wiring conductor 32. Likewise, the inductor 81 mainly serves as an inductor between the conductor wires 84 and 85. The capacitor 92 mainly serves as a capacitor between the B2 electrode 52 and the second ground wiring electrode 32. The inductor 82 mainly serves as an inductor between the conductor wires 87 and 88. The capacitor 93 mainly serves as a capacitor between the C2 electrode 53 and the second ground wiring electrode 32. The transmission line in question can be endowed with the characteristics shown in FIG. 5(b) and is therefore applicable to an optical module of 2.5 Gbit/s.

As described above, also in the embodiment illustrated in FIGS. 11 to 13, the passing frequency band of the transmission line can be changed by only changing the conductor wire connecting method even with the same transmission line wiring pattern.

Although in this embodiment the number of signal wiring conductors is set to 3, the number of electrodes in the first electrode group is set to 2, and that in the second electrode group is set to 3, there may be adopted other numbers. For example, the number of signal wiring conductors may be set to N, the number of first electrodes may be set to N−1, and the number of second electrodes may be set to N (N is an integer of 1 or more).

The transmission line shown in FIGS. 12 and 13 is applicable to an optical module as shown in FIGS. 7 to 9.

Although in the above description the present invention is applied to the transmission line on the package substrate, the invention may be applied to a relay substrate instead of the package substrate. A description will be given below about an example of an optical module in which the transmission line according to the present invention is applied to a relay substrate.

Figure 15:
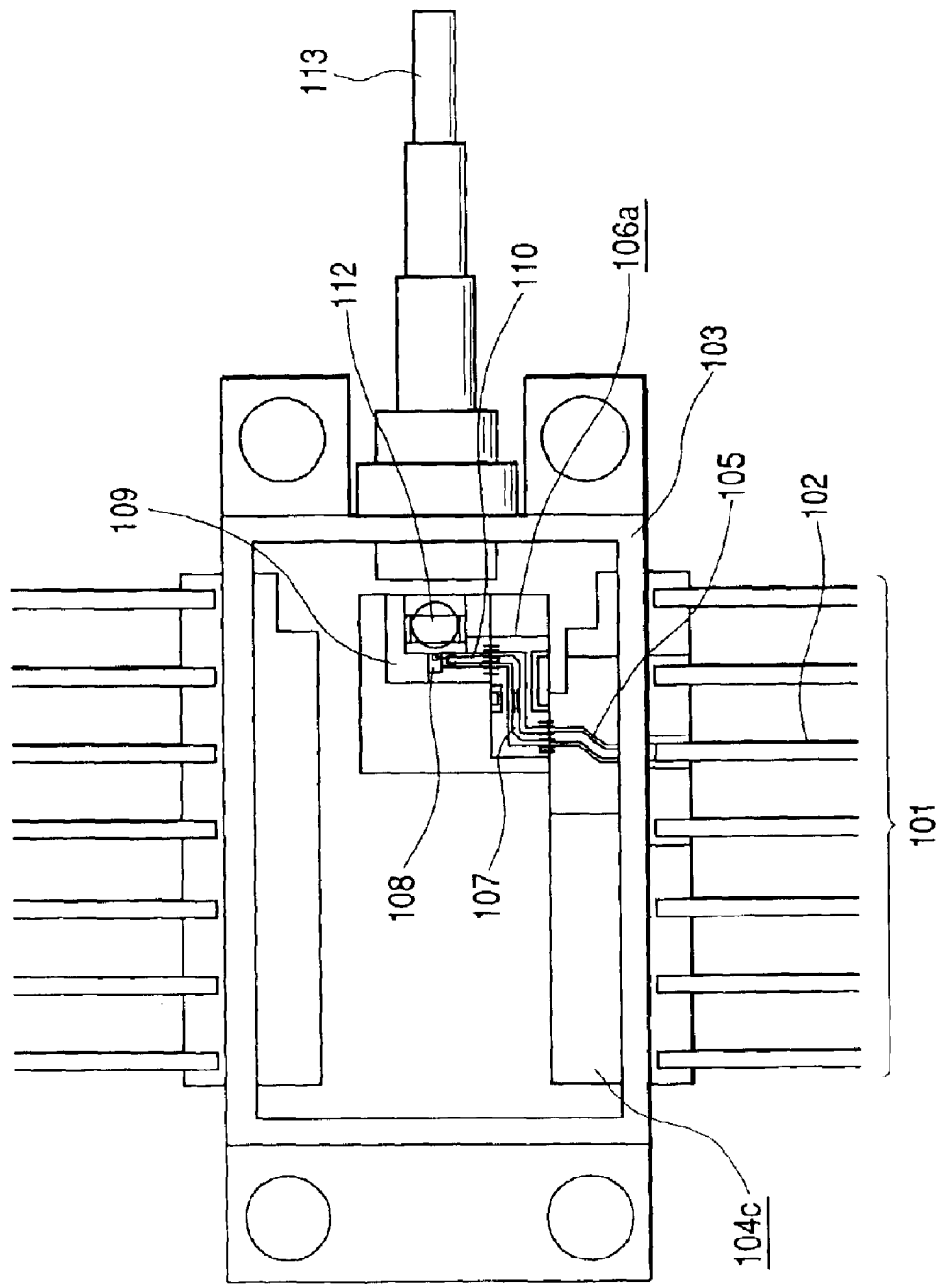
FIG. 15 is a top view showing an example of an entire optical module according to the present invention.
Figure 16:
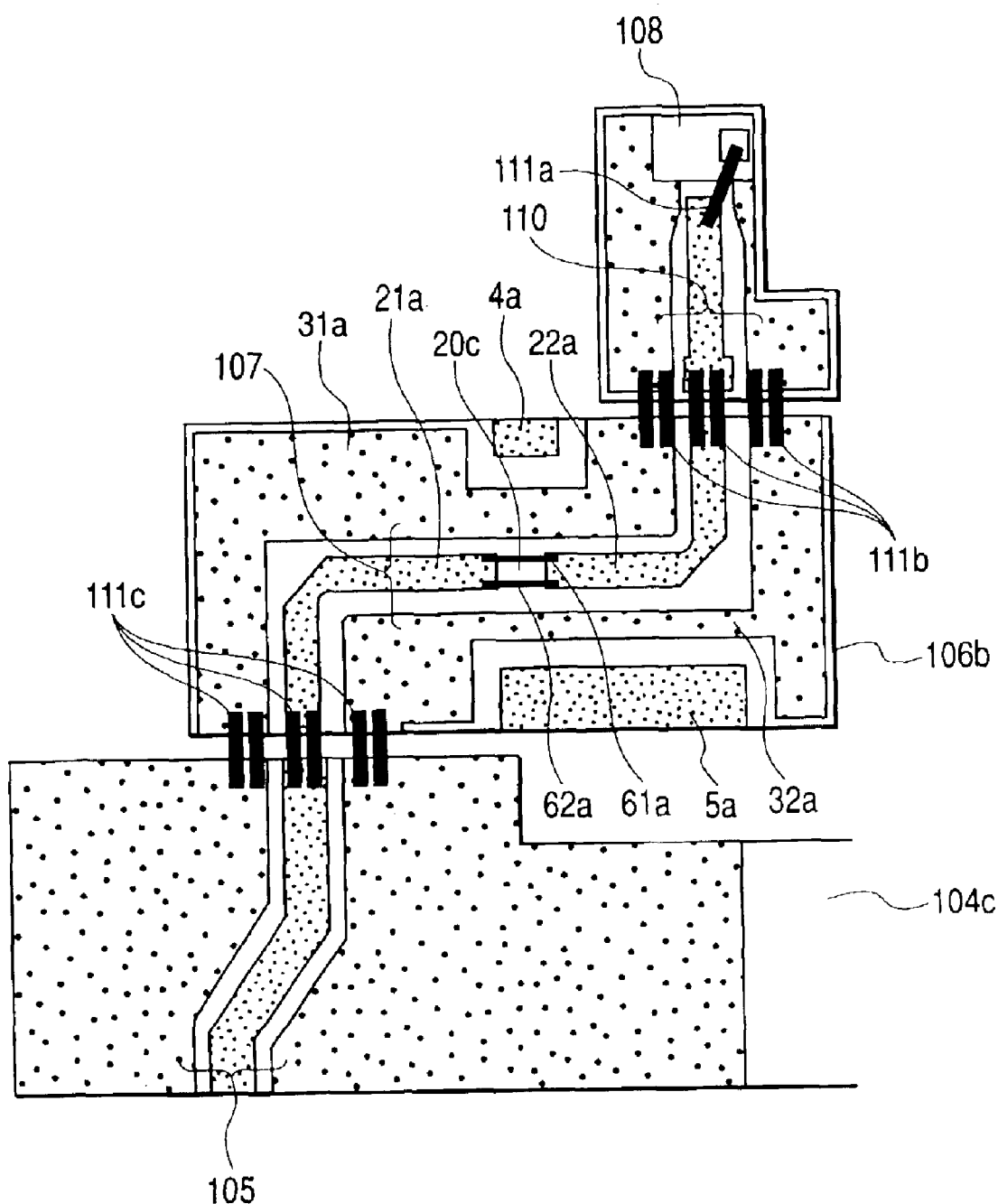
FIG. 16 is an enlarged top view showing a transmission line portion of an optical module in which the transmission line of FIG. 2 is applied to a relay substrate.
Figure 17:
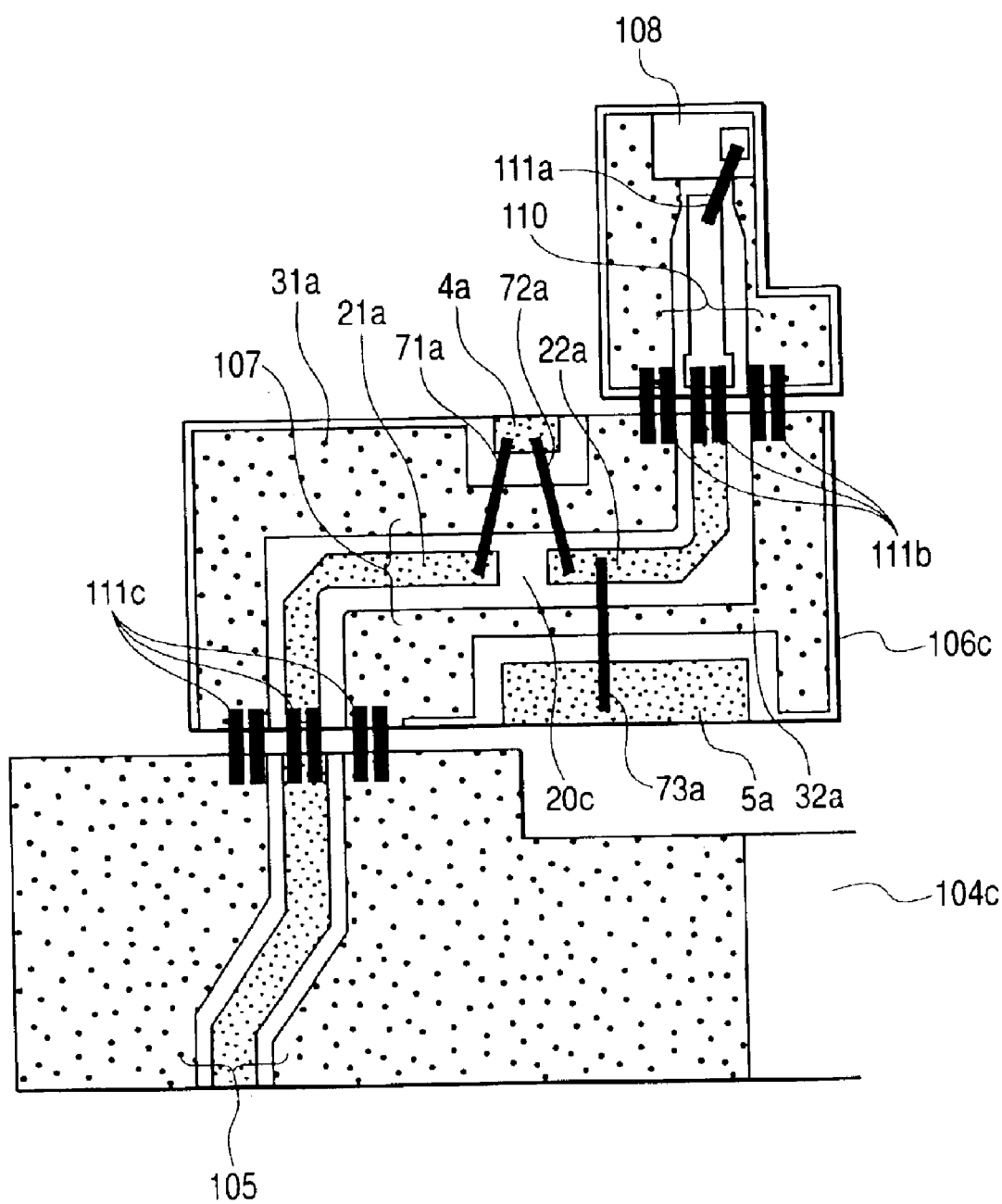
FIG. 17 is an enlarged top view showing a transmission line portion of an optical module in which the transmission line of FIG. 3 is applied to a relay substrate.
Figure 18:
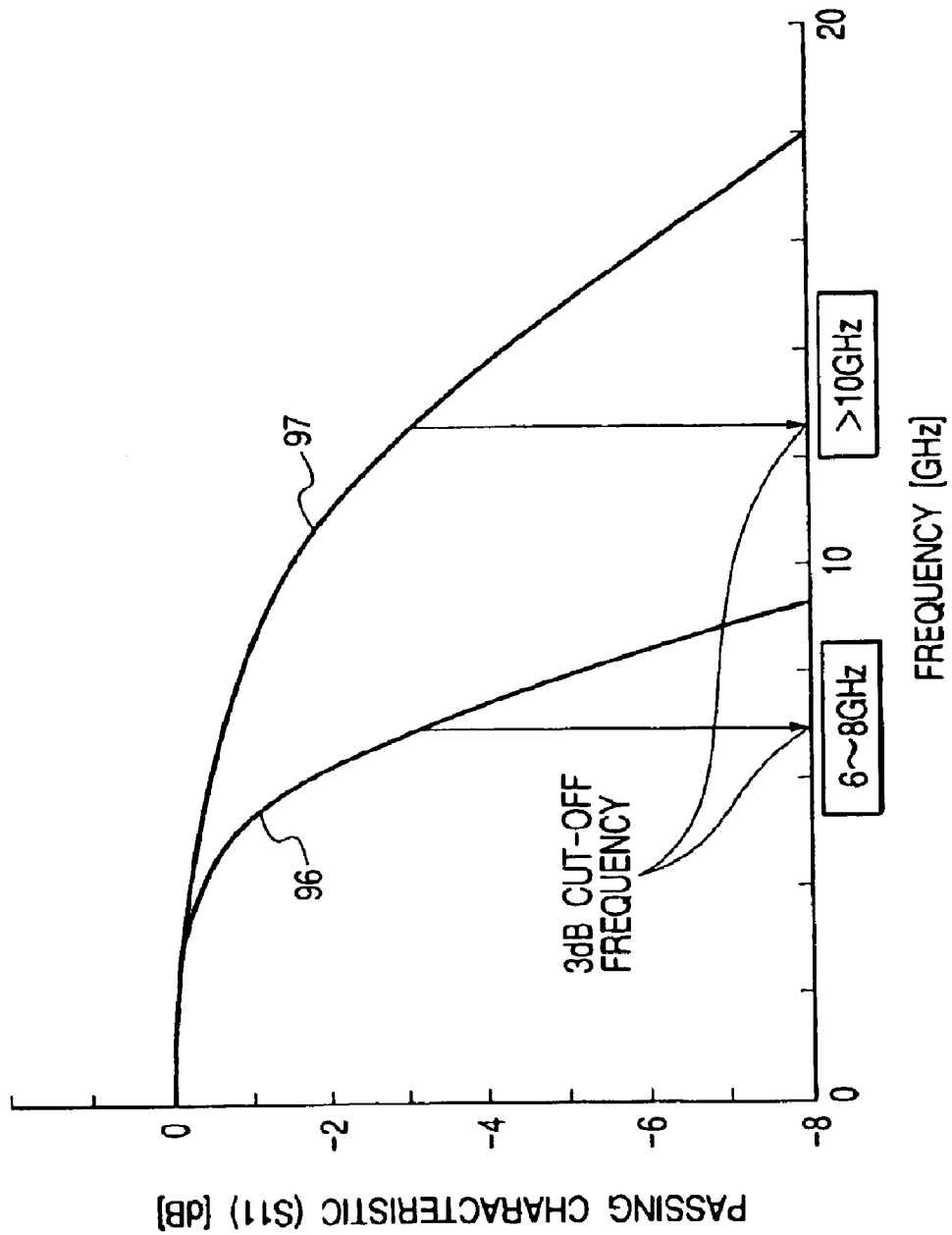
FIG. 18 is a characteristic diagram showing passing characteristics of optical modules.

FIG. 15 is a top view showing an example of an entire optical module according to the present invention. FIG. 16 is an enlarged top view showing a transmission line portion of an optical module in which the transmission line of FIG. 2 is applied to a relay substrate. FIG. 17 is an enlarged top view showing a transmission line portion of an optical module in which the transmission line of FIG. 3 is applied to a relay substrate. In these figures, the same components as in FIGS. 7 to 9 are identified by like reference numerals, and explanations thereof will be omitted.

In FIG. 15, a package substrate 104c corresponds to an ordinary transmission line, with no change in the conductor wire connecting method, and hence frequency characteristics do not vary. A relay substrate 106a is provided with a relay substrate shown in FIG. 16 or 17. Other structural points are the same as in FIG. 7.

FIG. 16 shows an example in which the transmission line of FIG. 2 is applied to a relay substrate 106b. The transmission line is in the form of a coplanar line in which first and second ground wiring conductors 31a, 32a are formed on both sides of first and second signal wiring conductors 21a, 22a. The signal wiring lines 21a and 22a are electrically insulated from each other at an intermediate disconnected portion 20c. The first and second ground wiring conductors 31a and 32a are formed on both sides of the first and second signal wiring conductors 21a and 22a. Near this transmission line is disposed a first electrode 4a which is electrically insulated from the first and second signal wiring conductors 21a, 22a and also from the first and second ground wiring conductors 31a, 32a. On the side opposite to the first electrode 4a with respect to the first and second signal wiring conductors 21a, 22a there is formed a second electrode 5a which is electrically insulated from the first and second signal wiring conductors 21a, 22a and also from the first and second ground wiring conductors 31a, 32a. In this example, the area of the first electrode 4a is smaller than that of the second electrode 5a. In the relay substrate 106b shown in FIG. 16, a portion near one end of the first signal wiring conductor 21a and a portion near one end of the second signal wiring conductor 22b are connected with each other using conductor wires 61a and 62a. Therefore, as described above in the example of package substrate, the relay substrate 106b can be endowed with the transmission characteristics shown in FIG. 5(a). Further, in the case where the relay substrate 106b is applied to an optical module of 10 Gbit/s, the optical module of FIG. 16 can obtain characteristics equal to the passing characteristic (S21) and reflection characteristic (S11) in FIG. 10(a).

FIG. 17 shows an example in which the transmission line of FIG. 3 is applied to a relay substrate 106c, in which a connecting construction in a transmission line wiring pattern using conductor wires is the same as in FIG. 3. More specifically, a portion near one end of the first signal wiring conductor 21a and the first electrode 4a are connected with each other using a conductor wire 71a, the first electrode 4a and a portion near one end of the second signal wiring conductor 22a are connected with each other using a conductor wire 72a, and the second signal wiring conductor 22a and a second electrode 73a are connected with each other. Therefore, an equivalent circuit of this transmission line is the same circuit as the equivalent circuit of FIG. 4 and the relay substrate 106c can be endowed with the transmission characteristics shown in FIG. 5(b), hence can be endowed with characteristics equal to the transmission characteristics of the optical module shown in FIG. 10(b), so is applicable to an optical module of 2.5 Gbit/s.

By constituting the transmission line wiring pattern of the relay substrate 106 as in FIG. 11 and by making connections with use of conductor wires as in FIG. 12 or 13 there can be obtained an optical module of 10 Gbit/s or of 2.5 Gbit/s.

According to the present invention, as set forth above, even if transmission lines having the same wiring pattern shape are applied to optical modules of different bit rates, all that is required is only changing conductor wire connections, whereby good transmission characteristics can be attained even for such different bit rates of optical modules. Consequently, it is possible to make components common to each other between optical modules and hence possible to attain the reduction of cost of the optical modules.

What is claimed is:

1. A transmission line characterized in that on a dielectric substrate there are formed a first signal wiring conductor, a second signal wiring conductor insulated from said first signal wiring conductor, a first electrode positioned near said first and said second signal wiring conductor, a second electrode positioned near said second signal wiring conductor, and a ground wiring conductor positioned in adjacency to said second electrode, wherein an end portion of said first signal wiring conductor and said first electrode are connected with each other using a first conductor, wherein said first electrode and said second signal wiring conductor are connected with each other using a second conductor, said second signal wiring conductor and said second electrode are connected with each other using a third conductor, wherein an inductor is constituted by said first and said second conductor, and a capacitor is constituted by said second electrode and said ground wiring conductor.

2. A transmission line according to claim 1, wherein said first and said second signal wiring conductor are connected with each other using, a conductor.

3. A transmission line according to claim 1, wherein the area of said second electrode is larger than that of said first electrode.

4. A transmission line according to claim 2, wherein said conductor is a conductor wire.

5. A transmission line according to claim 1, wherein said conductors are conductor wires.

6. A transmission line characterized in that on a dielectric substrate there are formed n number of mutually insulated signal wiring conductors, a first electrode group positioned near said n number of signal wiring conductors and having (n−1) number of mutually insulated electrodes, a second electrode group positioned near said n number of signal wiring conductors and having n number of mutually insulated electrodes, and a ground wiring conductor positioned in adjacency to the electrodes of said second electrode group, wherein adjacent said signal wiring conductors are connected in series through mutually different electrodes included in said first electrode group, wherein said signal wiring conductors are connected to mutually different electrodes included in said second electrode group, wherein inductors are formed by conductors which connect said first electrode group and said signal wiring conductors with each other, and capacitors are formed by the electrodes included in said second electrode group, and said ground wiring conductor which surrounds said electrodes.

7. A transmission line according to claim 6, wherein said signal wiring conductors are interconnected using conductors so that all of the signal wiring conductors from the first to the $n^{th}$ signal wiring conductors are connected in series.

8. An optical module comprising a transmission substrate for the transmission of an electric signal and an optical modulator which is driven with the electric signal transmitted by said transmission substrate and which generates a laser beam, characterized by having the transmission line described in any of claim 1 or 2 as a transmission line on said transmission substrate.

9. An optical module comprising a transmission substrate for the transmission of an electric signal, an optical modulator which is driven with an electric signal transmitted by said transmission substrate and which generates a laser beam, and a module package which houses therein at least a part of said transmission substrate and said optical modulator, said transmission substrate including a dielectric substrate on which is formed a transmission line for conducting an externally provided electric signal to the interior of said module package, said transmission line formed on said dielectric substrate comprising the transmission line described in any of claim 1 or 2.

10. An optical module comprising a transmission substrate for the transmission of an electric signal, an optical modulator which is driven with an electric signal transmitted by said transmission substrate and which generates a laser beam, and a module package which houses therein at least a part of said transmission substrate and said optical modulator, said transmission substrate including a first dielectric substrate on which is formed a transmission line for conducting an externally provided electric signal to the interior of said module package and a second dielectric substrate on which is formed a transmission line for conducting an electric signal provided from said first dielectric substrate to said optical modulator, said transmission line formed on said second dielectric substrate comprising the transmission line described in any of claims 1 or 2.

* * * * *